United States Patent
Bour

(10) Patent No.: US 9,127,364 B2
(45) Date of Patent: Sep. 8, 2015

(54) REACTOR CLEAN

(75) Inventor: David P. Bour, Cupertino, CA (US)

(73) Assignee: Alta Devices, Inc., Sunnyvale, CA (US)

( * ) Notice: Subject to any disclaimer, the term of this patent is extended or adjusted under 35 U.S.C. 154(b) by 775 days.

(21) Appl. No.: 12/913,688

(22) Filed: Oct. 27, 2010

(65) Prior Publication Data

US 2011/0268880 A1      Nov. 3, 2011

Related U.S. Application Data

(60) Provisional application No. 61/255,723, filed on Oct. 28, 2009.

(51) Int. Cl.
| | |
|---|---|
| C23C 16/00 | (2006.01) |
| C23C 16/54 | (2006.01) |
| C23C 16/30 | (2006.01) |
| C23C 16/455 | (2006.01) |
| H01L 21/67 | (2006.01) |
| H01L 21/677 | (2006.01) |

(52) U.S. Cl.
CPC ............... *C23C 16/54* (2013.01); *C23C 16/301* (2013.01); *C23C 16/45519* (2013.01); *H01L 21/6719* (2013.01); *H01L 21/6776* (2013.01); *H01L 21/67173* (2013.01)

(58) Field of Classification Search
CPC .................................................. C23C 16/45519
USPC ...................................... 427/255.28; 118/715
See application file for complete search history.

(56) References Cited

U.S. PATENT DOCUMENTS

| | | | |
|---|---|---|---|
| 3,785,853 A * | 1/1974 | Kirkman et al. | ......... 427/255.23 |
| 4,316,430 A | 2/1982 | Jolly et al. | |
| 4,993,358 A | 2/1991 | Mahawili | |
| 5,059,770 A | 10/1991 | Mahawili | |

(Continued)

FOREIGN PATENT DOCUMENTS

| | | |
|---|---|---|
| JP | 2004055595 A | 2/2004 |
| JP | 2007231361 A | 9/2007 |

(Continued)

OTHER PUBLICATIONS

PCT Int'l Search Report and Written Opinion for Int'l Application No. PCT/US2009/045709 dated Jan. 12, 2010.

(Continued)

*Primary Examiner* — Elizabeth Burkhart
(74) *Attorney, Agent, or Firm* — Thomas Schneck; Gina McCarthy

(57) ABSTRACT

A method and apparatus for performing chemical vapor deposition (CVD) processes is provided. In one embodiment, the apparatus comprises a reactor body having a processing region, comprising a wafer carrier track having a wafer carrier disposed thereon, at least one sidewall having an exhaust assembly for exhausting gases from the processing region, a lid assembly disposed on the reactor body, comprising a lid support comprising a first showerhead assembly for supplying reactant gases to the processing region, a first isolator assembly for supplying isolation gases to the processing region, a second showerhead assembly for supplying reactant gases to the processing region, and a second isolator assembly for supplying isolation gases to the processing region, wherein the first showerhead assembly, the first isolator assembly, the second showerhead assembly, and the second isolator assembly are consecutively and linearly disposed next to each other.

8 Claims, 7 Drawing Sheets

(56) References Cited

U.S. PATENT DOCUMENTS

| | | | |
|---|---|---|---|
| 5,122,391 A | 6/1992 | Mayer | |
| 5,304,398 A | 4/1994 | Krusell et al. | |
| 5,312,490 A * | 5/1994 | Wilkinson | 118/733 |
| 5,626,677 A | 5/1997 | Shirahata | |
| 5,792,272 A | 8/1998 | van Os et al. | |
| 6,001,267 A | 12/1999 | Os et al. | |
| 6,143,080 A | 11/2000 | Bartholomew et al. | |
| 6,652,650 B2 | 11/2003 | Yang et al. | |
| 8,008,174 B2 | 8/2011 | He et al. | |
| 2004/0244686 A1 | 12/2004 | Cho et al. | |
| 2006/0249077 A1 | 11/2006 | Kim et al. | |
| 2007/0092732 A1 | 4/2007 | Rose et al. | |
| 2007/0218204 A1 | 9/2007 | Garg et al. | |
| 2007/0259502 A1 * | 11/2007 | Bour et al. | 438/285 |
| 2007/0264807 A1 | 11/2007 | Leone et al. | |
| 2009/0324379 A1 | 12/2009 | He et al. | |
| 2009/0325367 A1 | 12/2009 | He et al. | |
| 2010/0092668 A1 | 4/2010 | Hegedus | |
| 2010/0206229 A1 | 8/2010 | He et al. | |
| 2010/0206235 A1 | 8/2010 | He et al. | |
| 2010/0209082 A1 | 8/2010 | He et al. | |
| 2010/0209620 A1 | 8/2010 | He et al. | |
| 2010/0209626 A1 | 8/2010 | He et al. | |
| 2010/0212591 A1 | 8/2010 | He et al. | |
| 2010/0229793 A1 | 9/2010 | He et al. | |
| 2011/0268880 A1 | 11/2011 | Bour | |

FOREIGN PATENT DOCUMENTS

| | | |
|---|---|---|
| KR | 100220444 B1 | 9/1999 |
| WO | WO2004027112 A2 | 4/2004 |
| WO | WO2010107837 A2 | 9/2010 |
| WO | WO2010107839 A2 | 9/2010 |
| WO | WO2010107843 A2 | 9/2010 |
| WO | WO2010108835 A2 | 9/2010 |

OTHER PUBLICATIONS

PCT Int'l Search Report and Written Opinion for Int'l Application No. PCT/US2009/060260.

* cited by examiner

REACTOR CLEAN

CROSS-REFERENCE TO RELATED APPLICATION

This application is claiming under 35 USC 119(e), the benefit of provisional patent application Ser. No. 61/255,723, filed Oct. 28, 2009, which is incorporated herein by reference.

BACKGROUND OF THE INVENTION

1. Field of the Invention

Embodiments of the present invention generally relate to methods and apparatuses for vapor deposition, and more particularly, to chemical vapor deposition processes and chambers.

2. Description of the Related Art

Chemical vapor deposition ("CVD") is the deposition of a thin film on a substrate by the reaction of vapor phase chemicals. Chemical vapor deposition reactors are used to deposit thin films of various compositions on the substrate. CVD is highly utilized in many activities, such as the semiconductor industry.

There are numerous types of CVD reactors for very different applications. For example, one type of reactor includes atmospheric pressure reactors and another type of reactor includes low-pressure reactors. These distinct designs address a variety of challenges that are encountered during a CVD process, such as depletion effects, contamination issues, and reactor maintenance.

Notwithstanding the many different reactor designs, there is a continuous need for new and improved CVD reactor designs.

SUMMARY OF THE INVENTION

Embodiments of the invention generally relate to apparatuses for chemical vapor deposition (CVD) processes. In one embodiment, a CVD reactor is provided. The CVD reactor comprises a reactor body having a processing region, comprising a wafer carrier track having a wafer carrier disposed thereon, at least one sidewall having an exhaust assembly for exhausting gases from the processing region, a lid assembly disposed on the reactor body, comprising a lid support comprising a first showerhead assembly for supplying reactant gases to the processing region, a first isolator assembly for supplying isolation gases to the processing region, a second showerhead assembly for supplying reactant gases to the processing region, a second isolator assembly for supplying isolation gases to the processing region, wherein the first showerhead assembly, the first isolator assembly, the second showerhead assembly, and the second isolator assembly are consecutively and linearly disposed next to each other, and a lamp assembly having a plurality of lamps disposed below the wafer carrier track.

In another embodiment, a CVD system is provided. The CVD system comprises one or more isolated processing regions each comprising a showerhead assembly disposed in a reactor lid assembly for supplying process gases to the isolated processing region and one or more exhaust assemblies for exhausting processing gases from the one or more isolated processing regions, wherein each isolated processing region is defined by a first isolator assembly disposed in the lid assembly for supplying isolation gases to the isolated processing region, a second isolator assembly disposed in the lid assembly for supplying isolation gases to the isolated processing region, and a wafer carrier track positioned below the lid assembly, wherein the showerhead assembly is positioned between the first isolator assembly and the second isolator assembly.

In yet another embodiment, a method for processing a wafer within a chemical vapor deposition reactor is provided. The method comprises heating at least on wafer disposed on a wafer carrier by exposing a lower surface of a wafer carrier track to a radiation emitted from a lamp assembly, wherein the wafer carrier is disposed on the wafer carrier track within the chemical vapor deposition reactor, traversing the wafer carrier along the wafer carrier track through a first isolated processing region comprising a first isolator assembly, a first showerhead assembly, a second isolator assembly, and a first exhaust assembly positioned below the first showerhead assembly, exposing the wafer to a process gas flowing from the first isolator assembly, exposing the wafer to a first mixture of gaseous precursors flowing from the first showerhead assembly, exposing the wafer to a process gas flowing from the second isolator assembly, traversing the wafer carrier along the wafer carrier track through a second isolated processing region comprising the second isolator assembly, a second showerhead assembly, a third isolator assembly, and a second exhaust assembly, exposing the wafer to a second mixture of gaseous precursors flowing from the second showerhead assembly, exposing the wafer to a process gas flowing from the third isolator assembly, and removing gases from the vapor deposition reactor through the first exhaust assembly and the second exhaust assembly.

BRIEF DESCRIPTION OF THE DRAWINGS

So that the manner in which the above recited features of the invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

DETAILED DESCRIPTION

Figure 1:
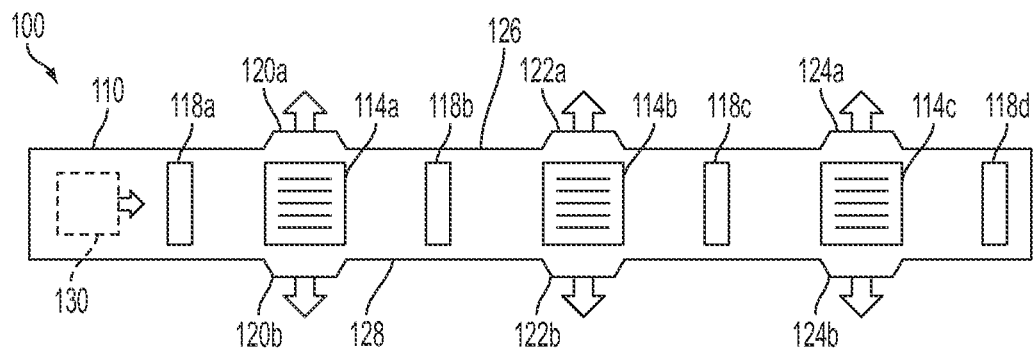
FIG. 1 is a schematic plan view of one embodiment of a CVD reactor according to embodiments described herein.

Embodiments of the invention generally relate to an apparatus and a method of chemical vapor deposition ("CVD"). As set forth herein, embodiments of the invention is described as they relate to an atmospheric pressure CVD reactor and metal-organic precursor gases. It is to be noted, however, that aspects of the invention are not limited to use with an atmospheric pressure CVD reactor or metal-organic precursor gases, but are applicable to other types of reactor systems and precursor gases. To better understand the novelty of the apparatus of the invention and the methods of use thereof, reference is hereafter made to the accompanying drawings.

According to one embodiment of the invention, an atmospheric pressure CVD reactor is provided. The CVD reactor may be used to provide multiple epitaxial layers on a substrate, such as a gallium arsenide substrate. These epitaxial layers may include aluminum gallium arsenide, gallium arsenide, and phosphorous gallium arsenide. These epitaxial layers may be grown on the gallium arsenide substrate for later removal so that the substrate may be reused to generate additional materials. In one embodiment, the CVD reactor may be used to provide solar cells. These solar cells may further include single junction, heterojunction, or other configurations. In one embodiment, the CVD reactor may be configured to develop a 2.5 watt wafer on a 10 centimeter by 10 centimeter substrate. In one embodiment, the CVD reactor may provide a throughput range of about 1 substrate per minute to about 10 substrates per minute.

In certain embodiments of continuous-feed (CF) MOCVD reactors, the wafer moves continuously along a track, through various zones where epitaxial layers comprising an aluminum gallium arsenide (AlGaAs) photovoltaic cell are sequentially deposited. The epitaxial growth occurs under showerhead gas injectors and isolation between the growth zones is provided by either downward injection of an isolation gas, or vertical evacuation of exhaust gases. The exhaust and isolation injectors are placed alternately along the CF track.

Unlike conventional (cold-wall) MOCVD reactors, the chamber walls of the CF MOCVD chambers are maintained at a high temperature (~300° C.) in order to desorb deposits (e.g. arsenic compounds) which would otherwise accumulate on the chamber walls. Over time, these deposits typically build up and flake off, introducing particulates into the gas stream. However, by providing a very high wall/ceiling temperature, the arsenic deposits coating the reactor walls have a sufficiently high vapor pressure such that the evaporation rate exceeds the accumulation rate and the reactor the walls remain perpetually clean.

However, there are two potential issues with current CF MOCVD reactor designs. First, since the reactor ceiling is in relatively intimate contact with the hot epitaxial surface, all pyrolysis products including AlGaAs, gallium, aluminum, and arsenic may condense on the reactor walls and ceiling. Although a wall temperature of 300° C. may minimize accumulation of arsenic deposits, it is impractical to maintain a wall temperature that renders GaAlAs, Al, and Ga deposits thermally unstable. GaAlAs, Al, and Ga have much lower vapor pressure than arsenic, so regardless of the very high wall and ceiling temperature these species may still accumulate on the reactor walls and ceiling.

Second, the current CF MOCVD reactor is ideal with respect to efficiency of reactant usage (because during its travel the wafer samples the full depletion profile of the growth-rate-governing group-III precursors). However, the wafer also passes under the exhaust ports as it traverses the CF MOCVD reactor track. Since solid As/Ga/Al/AlGaAs will be condensed in these exhaust ports, and may fall onto the wafer this presents an opportunity for particulate contamination of the wafer. Indeed, the pyrolysis products typically deposit preferentially near the exhaust ports.

In one embodiment, an alternative CF MOCVD reactor structure which reduces the potential for wafer contamination is provided. In one embodiment of the reactant structure, the reactant gas flow is transverse to the wafer travel, and all gas flow is exhausted symmetrically to the sides of the reactor, adjacent to the growth showerheads. Thus, the wafer does not move under the exhaust port where it may suffer particulate contamination. In one embodiment, additional flows are injected between each growth zone to provide isolation between the growth zones. In one embodiment, the showerhead injector which delivers the growth precursors may also project further into the chamber below the reactor ceiling ensuring that the (inert) isolation gas must flow between and around the growth zone showerheads, in order to provide more effective isolation between adjacent zones.

Figure 4A:
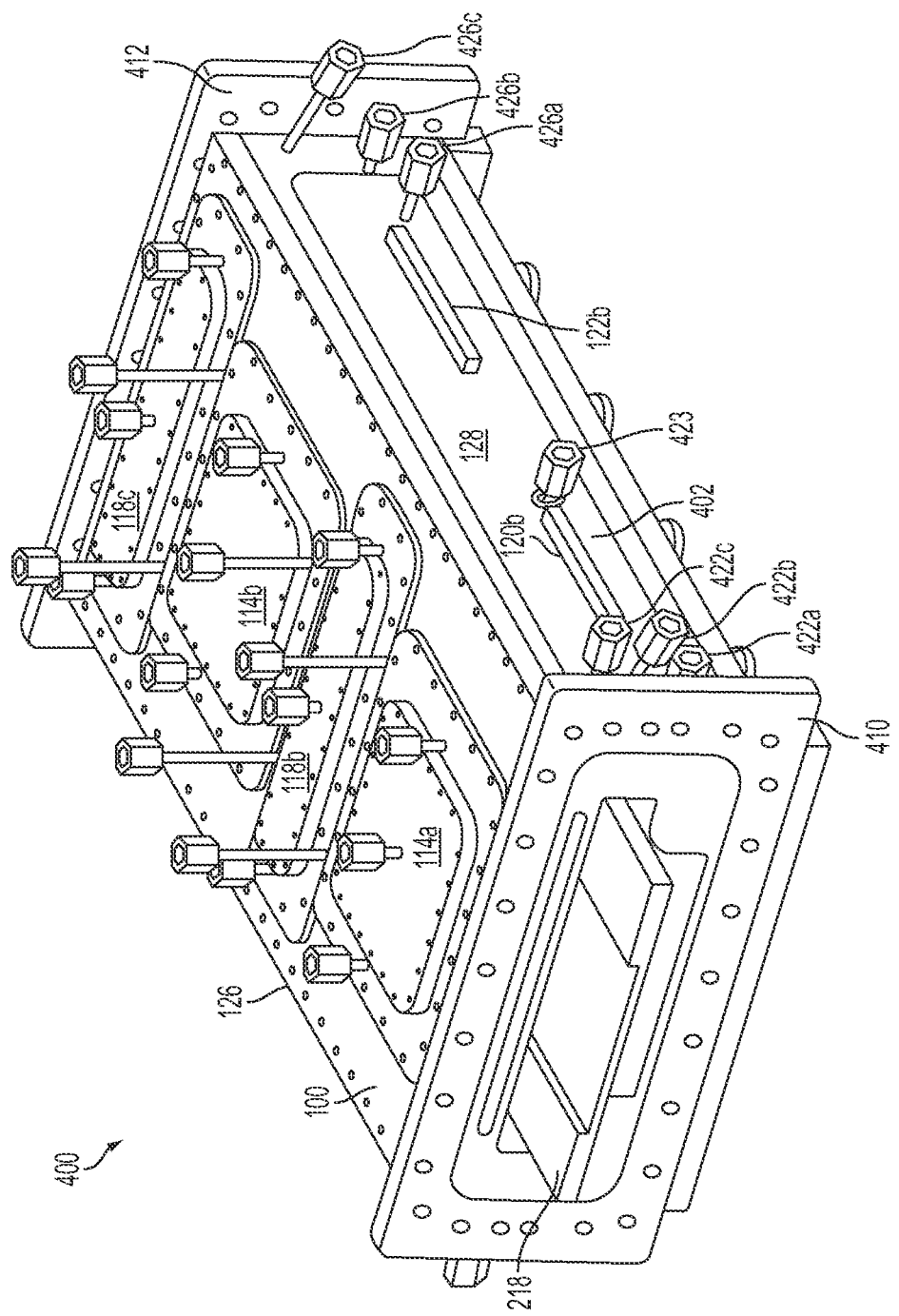
FIGS. 4A-4E illustrate views of one embodiment of a CVD reactor according to embodiments described herein.

System Design:

FIG. 1 is a schematic plan view of one embodiment of a CVD system 100 according to embodiments described herein. The CVD system 100 contains a reactor lid assembly 110 disposed on a reactor body assembly 402 (See FIG. 4A).

In one embodiment, the reactor body assembly 402 comprises a first sidewall 126, a second sidewall 128, and a wafer track assembly 218 positioned below the lid assembly 110. In one embodiment, a wafer carrier 130 with one or more wafers 90 is positioned on the wafer track assembly 218.

In one embodiment, the reactor lid assembly 110 contains three showerhead assemblies 114a, 114b, 114c for delivering precursor gases to each respective processing region. The reactor assembly may also contain four isolator assemblies 118a, 118b, 118c, 118d for flowing an isolation gas into the CVD System to isolate each respective processing region from the other processing regions. A first isolator assembly 118a is linearly positioned before the first showerhead assembly 114a. A second isolator assembly 118b is positioned between the first showerhead assembly 114a and a second showerhead assembly 114b. A third isolator assembly 118c is positioned between the second showerhead assembly 114b and a third showerhead assembly 114c. A fourth isolator assembly 118d is positioned after the third showerhead assembly 114c.

A first isolated processing region 212a is defined between the first isolator assembly 118a, the second isolator assembly 118b, the reactor lid assembly 110, and the wafer track assembly 218. A second isolated processing region 212b is defined between the second isolator assembly 118b, the third isolator assembly 118c, the reactor lid assembly 110, and the wafer track assembly 218. A third isolated processing region 212c is defined between the third isolator assembly 118c, the fourth isolator assembly 118d, the reactor lid assembly 110 and the wafer track assembly 218. It should be understood that although only three isolated processing regions are shown, any number of processing regions may be used along with the embodiments described herein. In one embodiment, the number of isolated processing regions corresponds to the number of layers deposited on the layer. For example, in one embodiment where eight layers are deposited on the wafer, the system comprises eight isolated processing regions.

The first isolated processing region 212a further comprises a first pair of opposing exhaust assemblies 120a, 120b for exhausting gases from the first isolated processing region 212a. The second isolated processing region 212b further comprises a second pair of opposing exhaust assemblies 122a, 122b for exhausting gases from the second isolated processing region 212b. The third processing region 212c further comprises a third pair of opposing exhaust assemblies 124a, 124b for exhausting gases from the third isolated processing region 212c. A vacuum pump (not shown) may be coupled with the exhaust assembly for exhausting gases from the isolated processing regions and/or maintaining each isolated processing region at a desired pressure.

In one embodiment, each exhaust assembly 120a, 120b, 122a, 122b, 124a, and 124b is positioned in a sidewall 126, 128. For example, with reference to the first isolated processing region 212a, the exhaust assembly 120a is positioned in the first sidewall 126 and the exhaust assembly 120b is positioned opposite the exhaust assembly 120a in the second sidewall 128. In one embodiment, the first pair of exhaust assemblies 120a, 120b is positioned adjacent to the first showerhead assembly 114a. In one embodiment, the second pair of exhaust assemblies 122a, 122b is positioned adjacent to the second showerhead assembly 114b. In one embodiment, the third pair of exhaust assemblies 124a, 124b is positioned adjacent to the third showerhead assembly 114c. In one embodiment each opposing exhaust assembly 120a, 122a, 124a is laterally positioned relative to the other opposing exhaust assembly 120b, 122b, 124b such that gases are exhausted symmetrically from each isolated processing region 212a, 212b, 212c via the opposing exhaust assemblies.

Figure 2:
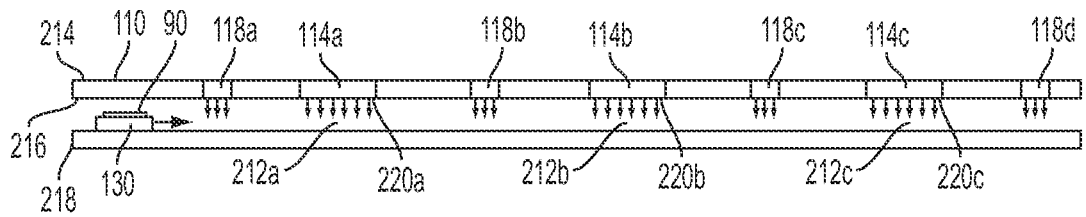
FIG. 2 is a schematic side view of one embodiment of a CVD reactor according to embodiments described herein.

FIG. 2 is a schematic cross-sectional side view of one embodiment of the CVD system 100 according to embodiments described herein. In one embodiment, the reactor lid assembly 110 has a top surface 214 and a bottom surface 216. In one embodiment, as shown in FIG. 2, the bottom 220a, 220b, 220c of each showerhead assembly 114a, 114b, 114c is flush with the bottom surface 216 of the reactor lid assembly 110.

Figure 3:
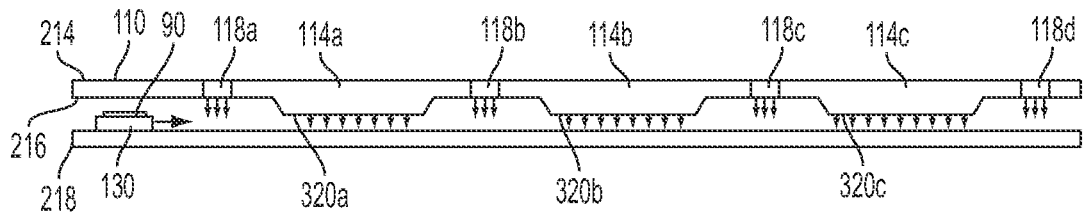
FIG. 3 is a schematic side view of one embodiment of a CVD reactor according to embodiments described herein.

FIG. 3 is a schematic side view of another embodiment of the CVD system 100 according to embodiments described herein. The CVD system 100 depicted in FIG. 3 is similar to the CVD system 100 depicted in FIG. 2, however, a bottom 320a, 320b, 320c of each of the showerhead assemblies 114a, 114b, 114c extend downward relative to the bottom surface 216 of the lid assembly 110 into each of the corresponding isolated processing regions 212a, 212b, 212c. Positioning each of the showerhead assemblies 114a, 114b, 114c below the bottom surface 216 of the lid assembly 110 provides for effective isolation between adjacent processing regions of the CVD system such that isolation gases flowing into each processing region, for example, via the first isolator assembly 118a and the second isolator assembly 118b flow between and around the first showerhead assembly 114a.

FIGS. 4A-4D illustrate views of one embodiment of a CVD reactor system 400 according to embodiments described herein. As described above, the CVD system 100 may comprise multiple CVD reactors. The CVD reactor system 400 depicted in FIG. 4A contains reactor lid assembly 110 disposed on reactor body assembly 402.

Figure 4B:
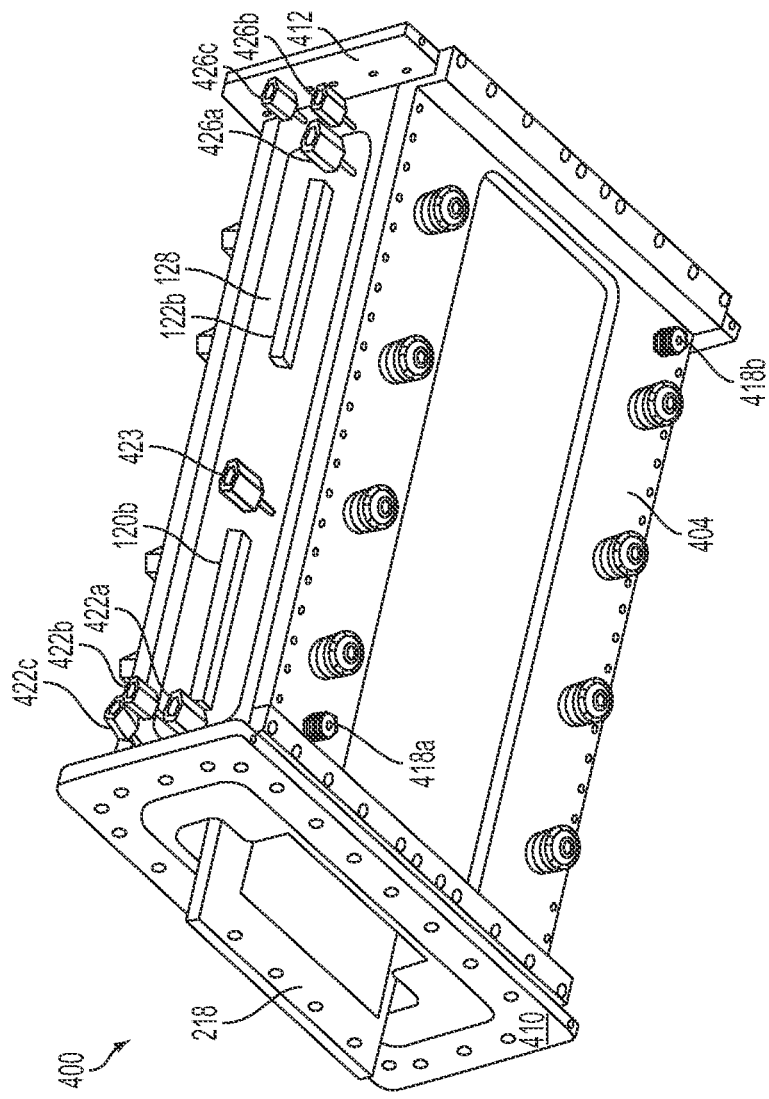
Figure 4C:
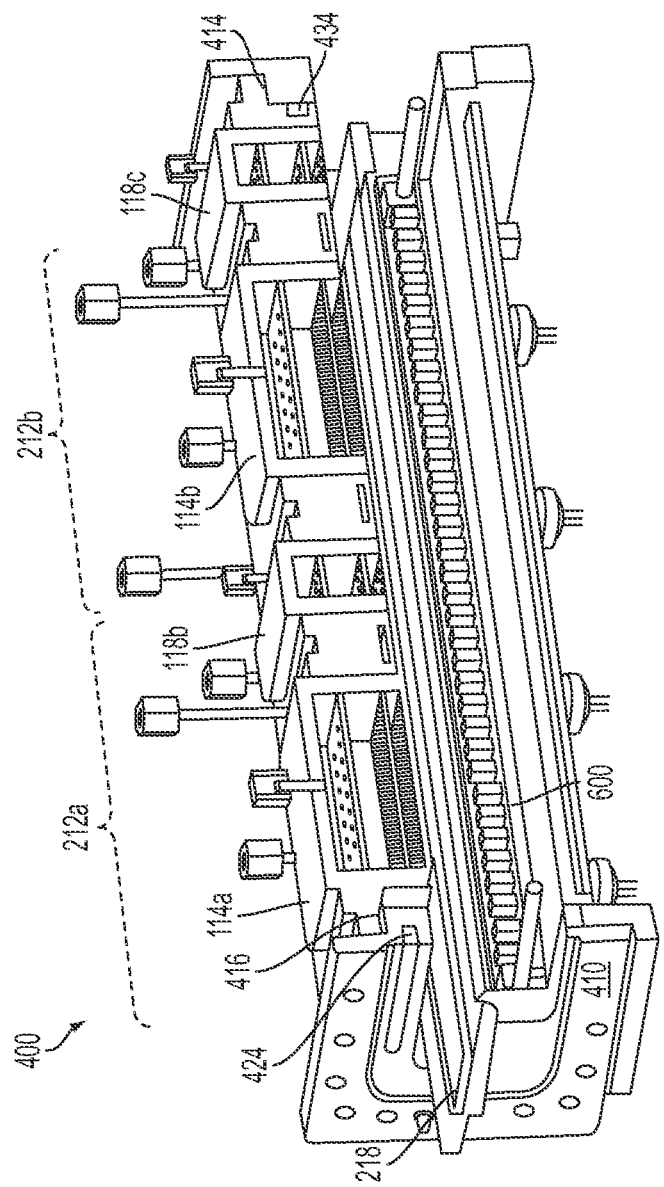

Reactor lid assembly 110 contains second isolator assembly 118b, disposed between the first showerhead assembly 114a and the second showerhead assembly 114b. Reactor lid assembly 110 also contains third isolator assembly 118c positioned after the second showerhead assembly 114b. FIG. 4C depicts system 100 containing two isolated processing regions, such as first isolated processing region 212a and second isolated processing region 212b. The first isolated processing region 212a contains first showerhead assembly 114a and second isolator assembly 118b while the second isolated processing region 212b contains the second showerhead assembly 114b and the third isolator assembly 118c. In one embodiment, the second isolator assembly 118b may be used to flow gas to separate the first showerhead assembly 114a and the second showerhead assembly 114b from each other, while the third isolator assembly 118c may be used to isolate the internal environment of reactor system 400 from another reactor connected to face plate 412.

Reactor body 402 contains face plate 410 on one end and face plate 412 on the opposite end. Face plates 410 and 412 may each independently be utilized to couple together additional reactors, similar or different than reactor 400, or to couple an end cap, an end plate, a wafer/substrate handler, or another device. In one example, face plate 410 of reactor 400 may be coupled to face plate 412 of another reactor (not shown). Similarly, face plate 412 of reactor 400 may be coupled to face plate 410 of another reactor (not shown). A seal or O-ring may be disposed between two joining face plates. In one embodiment, the seal may contain a metal, such as nickel or a nickel alloy. In one example, the seal is a knife edge metal seal. In another embodiment, the seal contains a polymer or an elastomer, such as a KALREZ® elastomer seal, available from DuPont Performance Elastomers L.L.C. In another embodiment, the seal may be a helix seal or an H-seal. The seal or O-ring should form a gas tight seal to prevent, or greatly reduce ambient gas from entering reactor 400. Reactor 400 may be maintained with little or no oxygen, water, or carbon dioxide during use or production. In one embodiment, reactor 400 may be maintained with an oxygen concentration, a water concentration, and/or a carbon dioxide concentration independently of about 100 ppb (parts per billion) or less, preferably, about 10 ppb or less, more preferably, about 1 ppb or less, and more preferably, about 100 ppt (parts per trillion) or less.

The first sidewall 126 and the second sidewall 128 extend along the length of reactor body 402. Sidewall 128 has upper surface (not shown) and sidewall 126 has upper surface 438. Upper surfaces 414 and 416 of reactor body 402 extend between upper surfaces 428 and 438. Upper surface 414 is on reactor body 402 just inside and parallel to face plate 410 and upper surface 416 is on reactor body 402 just inside and parallel to face plate 412. Gas inlet 423 is coupled to and extends from side 128. The levitation gas or carrier gas may be administered into reactor 400 through gas inlet 423. The levitation gas or carrier gas may contain nitrogen, helium, argon, hydrogen, or mixtures thereof.

Reactor body 402 is coupled to and in fluid communication with at least one heat exchanger as part of the heat regulation system. In some embodiments, reactor body 402 may be coupled to and in fluid communication with two, three, or more heat exchangers. FIG. 4B depicts inlet 418a and outlet 418b coupled to and in fluid communication with a lower portion 404 of reactor 400 and with the heat regulation system.

In one embodiment, inlets 422a, 422b, and 422c, and outlets 426a, 426b, and 426c are coupled to and extend from sidewall 128. At least one heat exchanger is coupled to and in fluid communication with inlets 422a, 422b, and 422c, and outlets 426a, 426b, and 426c. Inlets 422a, 422b, and 422c may receive a liquid from the heat exchangers while outlets 426a, 426b, and 426c send the liquid back to the heat exchanger. In one embodiment, each inlet 422a, 422b, or 422c is positioned in a lower position than each respective outlet 426a, 426b, or 426c, so that flowing liquid from each inlet 422a, 422b, or 422c upwardly flows through each connecting passageway to each respective outlet 426a, 426b, or 426c.

In another embodiment, inlets 432a, 432b, and 432c, and outlets 436a, 436b, and 436c are coupled to and extend from sidewall 126. At least one heat exchanger is coupled to and in fluid communication with inlets 432a, 432b, and 432c, and outlets 436a, 436b, and 436c. Inlets 432a, 432b, and 432c may receive a liquid from the heat exchanger while outlets 436a, 436b, and 436c send the liquid back to the heat exchanger.

Figure 4D:
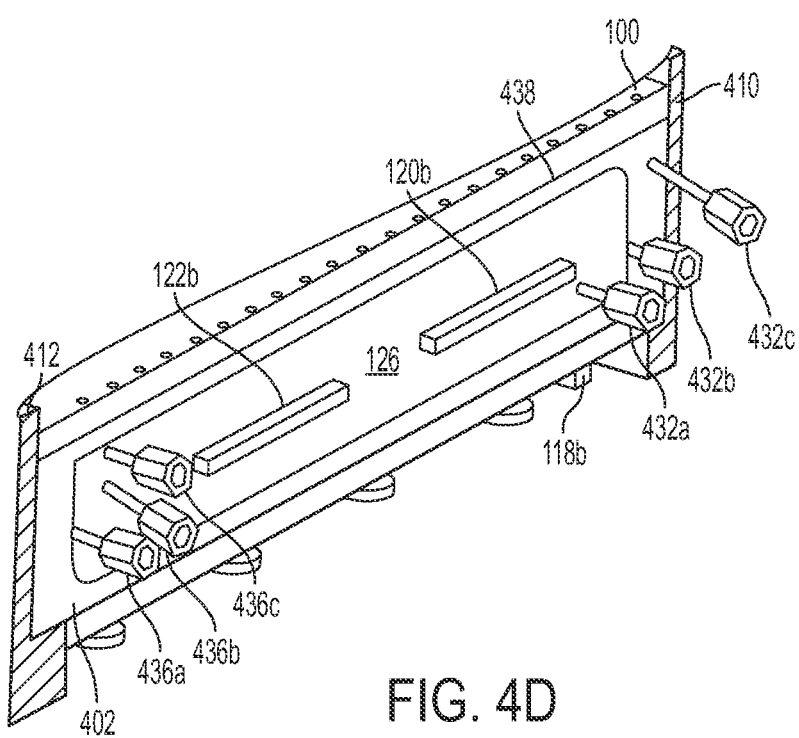

FIGS. 4C-4D illustrate reactor body 402 containing fluid passageways 424 and 434. In one example, a first fluid passageway (not shown) extends within sidewall 128 and along a partial length of reactor body 402. The first fluid passageway is coupled to and in fluid communication with inlet 422a and outlet 426a. Also, the first fluid passageway extends within sidewall 126 and along a partial length of reactor body 402. The first fluid passageway is coupled to and in fluid communication with inlet 432a and outlet 436a.

In another example, a second fluid passageway (not shown) extends within the shelf or bracket arm (not shown) within reactor body 402 and along a partial length of reactor body 402. The second fluid passageway is coupled to and in fluid communication with inlet 422b and outlet 426b. Also, the second fluid passageway extends within the shelf or bracket arm within reactor body 402 and along a partial length of reactor body 402. The second fluid passageway is coupled to and in fluid communication with inlet 432b and outlet 436b.

In another example, a third fluid passageway 424 extends from sidewall 128, through the width of reactor body 402, and to sidewall 126. Fluid passageway 424 is coupled to and in fluid communication with inlet 422c and outlet 432c. Also, the third fluid passageway 424 extends from sidewall 126, through the width of reactor body 402, and to sidewall 128. The third fluid passageway 424 is coupled to and in fluid communication with inlet 426c and outlet 436c.

In another embodiment, reactor body 402 contains wafer carrier track assembly 218 and heating lamp system 600 disposed therein. Heating lamp system 600 may be used to heat wafer carrier track assembly 218, wafer carriers, and wafers disposed above and within reactor 400. Wafer carrier track 218 may be on a shelf, such as bracket arm (not shown). Generally, wafer carrier track assembly 218 may be disposed between bracket arm and clamp arm (not shown). The bracket arm may contain fluid passageways (not shown) traversing therethrough.

In one embodiment, first spacer (not shown), such as a gasket or an O-ring may be disposed between the lower surface of wafer carrier track 218 and the upper surface of the bracket arm. Also, a second spacer (not shown), such as a gasket or an O-ring may be disposed between the upper surface of wafer carrier track 218 and the lower surface of the clamp arm. The first spacer and the second spacer are used to form space or a gap around wafer carrier track 218, which aids in the thermal management of wafer carrier track 218. In one example, the upper surface of bracket arm has a groove for containing the first spacer. Also, the lower surface of the clamp arm has a groove for containing the second spacer.

Figure 4E:
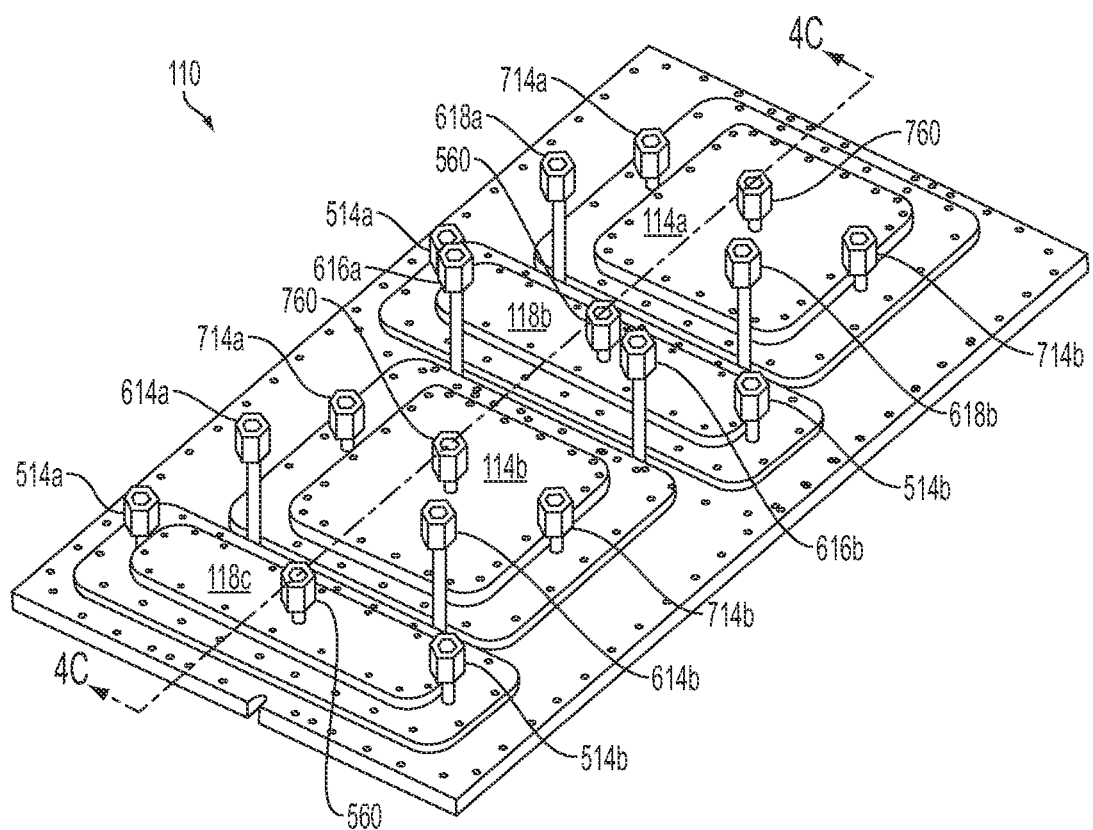

FIG. 4E depicts reactor lid assembly 110 according to another embodiment described herein. Reactor lid assembly 110 contains showerhead assembly 114a and isolator assembly 118b and showerhead assembly 114b and isolator assembly 118c disposed on lid assembly 110.

Reactor lid assembly 110 may be coupled to and in fluid communication with at least one heat exchanger as part of the heat regulation system. In some embodiments, reactor lid assembly 110 may be coupled to and in fluid communication with two, three, or more heat exchanger.

The heat regulation system of reactor lid assembly 110 contains inlets 614a, 616a, and 618a and outlets 614b, 616b, and 618b, as depicted in FIG. 4E. Each pair of the inlet and outlet is coupled to and in fluid communication with a passageway extending throughout reactor lid assembly 110. Inlets 614a, 616a, and 218a may receive a liquid from the heat exchanger while outlets 614b, 616b, and 218b send the liquid back to the heat exchanger. In some embodiments, the temperature regulation system utilizes heat exchangers to independently maintain reactor body assembly 402 and/or reactor lid assembly 110 at a temperature within a range from about 275° C. to about 325° C., preferably, from about 290° C. to about 310° C., such as about 300° C.

In one embodiment, isolator assemblies 118b, 118c contains gaseous inlet 560 disposed on the reactor lid assembly 110. Inlet 514a and outlet 514b may be independently coupled to and in fluid communication with a liquid reservoir or at least one heat exchanger within the temperature regulation system (not shown).

In one embodiment, showerhead assemblies 114a, 114b contain gaseous inlet 760 disposed on the reactor lid assembly 110 for delivering precursors to the showerhead assemblies 114a, 114b. Inlet 714a and outlet 714b may be independently coupled to and in fluid communication with a liquid reservoir or at least one heat exchanger within the temperature regulation system (not shown).

Clean Processes:

In certain embodiments described herein, cleaning processes for MOCVD reactors are provided. In one embodiment, the MOCVD reactor cleaning process is an in-situ cleaning process performed by flowing a corrosive gas into the reactor while the reactor is maintained at a high temperature. In one embodiment, the MOCVD reactor cleaning process is performed by etching deposits on the wall/ceiling continuously while epitaxial growth on the wafer proceeds. In one embodiment, a corrosive component is added to the growth chemistry (e.g. reactant and carrier gas) to etch chamber deposits while epitaxial growth proceeds. In one embodiment, the corrosive species is introduced in concert with the usual growth chemistry (e.g. diethylgallium chloride or arsenic chloride).

In conventional MOCVD reactors, the reactor must be disassembled and cleaned ex-situ every few runs. The steel parts of the reactor are cleaned with a sodium-hydroxide or potassium-hydroxide solution, accelerated by heating or addition of peroxide additives, while the quartz and graphite parts are cleaned in using a cleaning solution such as nitrohydrochloric acid ($HCl:HNO_3$) containing solution or hydrofluoric acid containing solution. Subsequently, the parts are rinsed, baked dry outside the reactor in an oven, and finally baked again at a higher temperature (>100° C. above process temperature) before resuming the epitaxial process. This is a very cumbersome process, and represents an unreasonable limitation of any high-throughput, continuous-feed reactor.

In one embodiment, in-situ chamber cleaning may be performed, by for example flowing a corrosive gas such as HCl or $Cl_2$ while the reactor is held at a high-temperature. However, for MOCVD reactor chambers incorporating showerhead injectors formed by a brazing process, such an in-situ cleaning is not considered viable because it may attack the Ni—Au braze metallurgy and destroy the showerhead. Thus in certain MOCVD reactors, such an in-situ cleaning process is undesirable for a high-throughput MOCVD reactor, as it reduces reactor up-time.

In one embodiment, the wall/ceiling deposits are etched continuously while growth proceeds. A corrosive component is added to the growth chemistry, for example the addition of small amounts of HCl or $Cl_2$ to the reactant and carrier gas stream. It is anticipated that the etch-rate of the wall/ceiling deposits will be much faster than for the epitaxial film, due to the poor structural quality and relatively large surface area of the wall/ceiling deposits. Consequently, proper adjustment of the corrosive gas flow etches the wall/ceiling deposits more rapidly. Ideally the deposits are etched more rapidly than they grow, effectively eliminating them, while the film is not appreciably etched.

In one embodiment, rather than the addition of a separate corrosive gas addition (HCl, $Cl_2$, etc.), the corrosive species may instead be introduced in concert with the usual precursors, for example via chlorinated precursors such as chlorinated aluminum, gallium, or arsenic precursors (e.g. diethylgallium chloride (DEGaCl), or arsenic chloride).

Figure 5:
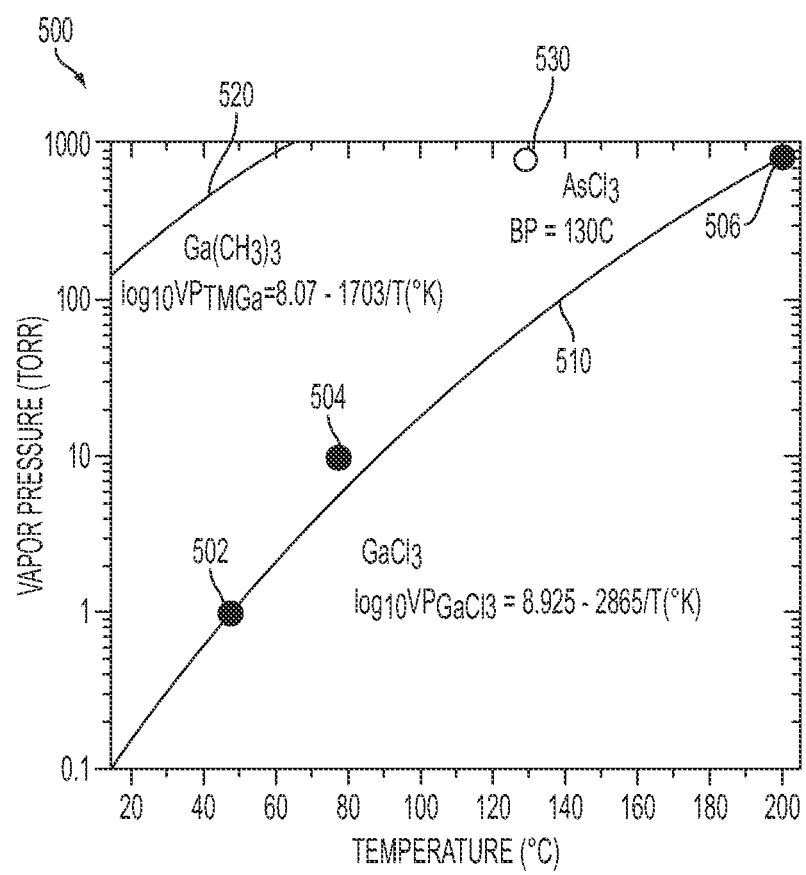
FIG. 5 is a plot demonstrating a vapor pressure curve of $GaCl_3$ in comparison with a vapor pressure curve of trimethylgallium (TMG).

FIG. 5 is a plot 500 demonstrating a vapor pressure curve of $GaCl_3$ in comparison with a vapor pressure curve of trimethylgallium (TMG). The etching of GaAs by HCl yields $GaCl_x$. Chlorinated species such as $GaCl_3$ have low vapor pressure; and therefore, depending on the surrounding conditions, may precipitate rather than remain in the vapor phase. This possibility must be addressed when considering the method of HCl introduction. The propensity for precipitation out of the gas phase is governed by the vapor pressure of $GaCl_x$. If the local partial pressure of the formed $GaCl_x$ exceeds its vapor pressure (at the local gas temperature), the gaseous solution is by definition supersaturated, and the excess $GaCl_x$ will precipitate. However, if the vapor concentration is undersaturated, the $GaCl_x$ will remain in the vapor phase. The vapor pressure of $GaCl_x$ is thus the relevant parameter determining precipitation.

An upper limit estimate for the vapor pressure of chlorinated gallium $GaCl_x$ may be obtained by considering the saturated case of triply-chlorinated gallium $GaCl_3$. This is so because smaller, lower-chlorinated molecules generally have higher vapor pressure (unless they oligomerize). Accordingly, the vapor pressure (VP) of $GaCl_3$ was estimated from the following data points found in the literature:

$VP_{GaCl3}(T)$=1 torr at 48° C.(point 502)

$VP_{GaCl3}(T)$=10 torr at 78° C.(point 504)

$VP_{GaCl3}(T)$=760 torr at 201° C.(boiling point)(point 506)

As shown in FIG. 5, these three data points (502, 504, and 506) were fit to a "standard" exponential VP characteristic (similar to that of MOVPE precursors), of the form $\log_{10}VP=A-B/T$. This fit is shown by the curve 510 in FIG. 5 below (with the three data points 502, 504, and 506 shown by the black circles). For comparison, the VP of trimethyl-gallium (TMGa) is shown curve 520. The exponential VP(T) fits for these chemical precursors are given by:

$VP_{GaCl3}(T)$=8.925−2865/$T(K)$ $VP_{TMGa}(T)$=8.07−1703/$T(K)$

The vapor pressure of $GaCl_3$ is more than two orders of magnitude less than TMGa; and as described it is expected that the vapor pressure of the lower-chlorinated species $GaCl_2$ and $GaCl$ will be greater than that of $GaCl_3$ (and therefore less likely to precipitate). Thus, since the $GaCl_3$ has the lowest vapor pressure among these chemicals, it represents a limiting worst-case for considering precipitation of gallium chloride.

In order to estimate whether precipitation of $GaCl_x$ can be avoided the partial pressure of $GaCl_x$ and the local temperature where it is formed must be known. In embodiments where the temperature of the interior chamber surface exceeds 300° C. in $GaCl_x$ precipitation should not be a problem. In embodiments, where the total pressure of the reactor is approximately 760 torr, and the vapor pressure of $GaCl_3$ is greater than this for any temperature above 200C, any $GaCl_x$ deposit will be unstable and evaporate. In addition, FIG. 5 shows that arsenic chlorides will also be unstable under similar pressure and temperature conditions (point 530, showing the boiling point of $AsCl_3$ is 130° C.). Thus, from the standpoint of thermal stability, it is apparent that in-situ cleaning using a corrosive chemistry is viable.

In a continuous-clean process (occurring continuously during growth), the minimum flow requirement of the corrosive gas is that which exactly compensates for the accumulation rate of the As/Ga/Al/AlGaAs on the surfaces. However, if this minimum flow is too high, the epitaxial film may also be appreciably etched and the continuous-clean scheme may not be viable.

There is a further potential benefit of continuous cleaning. Specifically, the addition of a corrosive component to the gas-chemistry may eliminate homogeneous (gas-phase) nucleation which produces particles and limits the growth rate. Homogeneous nucleation is generally not a factor for conventional MOCVD growth of AlGaAs. Indeed, the gas-phase particle formation is not a problem under more conventional growth regimes typically used for Group III-As devices (e.g. low growth rate and low pressure) because these conditions imply a relatively low precursor partial pressure which inhibits the gas-phase particle formation. However, certain embodiments are characterized by several critical differences which might greatly enhance the probability of gas-phase reactions. For example, certain embodiments are performed at a very high growth rate. This high growth rate implies that the precursor concentrations and their partial pressures are proportionally higher. Certain embodiments are performed at atmospheric pressure rather than reduced pressure as is typical for most AlGaAs MOCVD processes. This further increases the partial pressure of the reactant species (e.g. trimethylgallium, trimethylaluminum, and arsine), thus promoting a chemical reaction.

Homogeneous (gas-phase) nucleation of GaAs particles occurs when GaAs particles are formed by pyrolytic reactions in the thermal boundary over the wafers, rather than the intended epitaxial deposition on the surface itself. This particle formation is governed by the gas-phase chemistry, with the reactant concentration and local temperature playing a dominant role. Consequently, both high growth rate and elevated growth pressure encourage such gas-phase nucleation. This gas-phase particle formation is well-documented for the analogous GaN MOCVD growth chemistry (TMGa+$NH_3$), where it limits the maximum growth rate. In this case it has been demonstrated that the particles reside in a thin layer over the wafer surface, suspended by a photophoretic force. Once formed, the hot particles are themselves growth surfaces, so that additional TMGa causes the particles to grow larger, rather than causing the film to grow thicker. It is expected that the etch-rate of the gas-phase GaAs nanoparticles will be much faster than for the epitaxial film, because the small particles present such great surface area. Consequently, if the HCl flow is properly adjusted, the particles may be etched rapidly (ideally more rapidly than they grow, thus eliminating them), while the film is not appreciably etched. In this manner, the film growth rate may be increased by the addition of HCl, because the particles no longer parasitically consume the TMGa growth precursor. Thereby the HCl introduction may (counter-intuitively) enhance the GaAs film growth rate.

Finally, when establishing an in-situ, continuous-clean growth process by introducing small quantities of HCl or $Cl_2$ into the gas stream, it is desirable that no solid gallium- or arsenic-chlorides are formed where the gases are initially mixed. For example, from FIG. 5 it is apparent that if $GaCl_3$ is formed at room temperature, for which its vapor pressure is 0.2 Torr, the gas mixture must be sufficiently dilute to avoid precipitation. Consider the case of TMGa and HCl mixed at 25° C., reacting spontaneously to produce gallium chloride. To eliminate any precipitation of solid $GaCl_3$ the TMGa/HCl flows must be sufficiently small, and the carrier (dilution) flows sufficiently large, to ensure that the partial pressure of the formed $GaCl_3$ is less than 0.2 Torr, e.g., an undersaturated gas mixture (in fact, there is probably a significant energy barrier preventing the reaction of TMGa and HCl; so this represents a worst-case analysis). To avoid precipitation, only small flows of HCl may be used, to produce correspondingly small flows of $GaCl_3$ might be formed. However, this may translate into an insufficiently low etch rate for the wall deposits. Alternatively, it is clearly advantageous to form the $GaCl_3$ at higher temperatures to avoid precipitation. This may be accomplished by mixing the HCl into the gas stream in the showerhead, rather than in the (cold) switching manifold.

While the foregoing is directed to embodiments of the present invention, other and further embodiments of the invention may be devised without departing from the basic scope thereof, and the scope thereof is determined by the claims that follow.

The invention claimed is:

1. A method for processing a wafer within a chemical vapor deposition reactor, comprising:
heating at least one wafer disposed on a wafer carrier by exposing a lower surface of a wafer carrier track to a radiation emitted from a lamp assembly, wherein the wafer carrier is disposed on the wafer carrier track within the chemical vapor deposition reactor;
traversing the wafer carrier along the wafer carrier track through a first isolated processing region comprising a first isolator assembly, a first showerhead assembly, a second isolator assembly, and a first exhaust assembly positioned below the first showerhead assembly;
exposing the wafer to a process gas flowing from the first isolator assembly; exposing the wafer to a first mixture of gaseous precursors flowing from the first showerhead assembly;
exposing the wafer to a process gas flowing from the second isolator assembly;
traversing the wafer carrier along the wafer carrier track through a second isolated processing region comprising the second isolator assembly, a second showerhead assembly, a third isolator assembly, and a second exhaust assembly;
exposing the wafer to a second mixture of gaseous precursors flowing from the second showerhead assembly;
exposing the wafer to a process gas flowing from the third isolator assembly; and
removing gases from the vapor deposition reactor through the first exhaust assembly and the second exhaust assembly, wherein the first exhaust assembly and the second exhaust assembly each comprise a pair of opposing side exhaust assemblies wherein each side exhaust assembly is laterally positioned in a sidewall of the chemical vapor deposition reactor relative to the other side exhaust assembly such that gases are exhausted out of each side exhaust assembly transversely to the carrier track and symmetrically from each isolated processing region thereby preventing gas flow along the carrier track.

2. The method of claim 1, wherein the first exhaust assembly and the second exhaust assembly are positioned such that the wafer carrier does not travel directly under the first exhaust assembly and the second exhaust assembly when traversing the wafer carrier along the wafer track.

3. The method of claim 1, wherein gas flow is exhausted symmetrically to the side of the CVD reactor.

4. The method of claim 3, wherein the first mixture of precursor gases comprises a corrosive component added to the first mixture of precursor gases to etch deposits from the surfaces of the reactor while epitaxial growth proceeds.

5. The method of claim 4, wherein the corrosive component is selected from the group comprising hydrochloric acid, chlorine, chlorinated gallium, chlorinated arsenic, chlorinated aluminum, and combinations thereof.

6. The method of claim 4, further comprising flowing the corrosive component at a flow rate such that the flow of the corrosive component removes deposits from the surfaces of the reactor but does not etch films deposited on the wafer.

7. The method of claim 1 wherein the first isolator assembly, the first showerhead assembly, and the second isolator assembly are consecutively and linearly disposed next to each other, the second exhaust assembly is positioned below the second showerhead assembly, and the second isolator assembly, the second showerhead assembly, and the third isolator assembly are consecutively and linearly disposed next to each other.

8. The method of claim 1 wherein the first exhaust assembly comprises a first pair of opposing side exhaust assemblies and the second exhaust assembly comprises a second pair of opposing side exhaust assemblies spaced apart from the first pair of opposing side exhaust assemblies.

* * * * *